United States Patent [19]

Ota et al.

[11] Patent Number: 4,789,222
[45] Date of Patent: Dec. 6, 1988

[54] ILLUMINATING OPTICAL SYSTEM

[75] Inventors: Masakatu Ota, Tokyo; Takashi Omata, Yokosuka, both of Japan

[73] Assignee: Canon Kabushiki Kaisha, Tokyo, Japan

[21] Appl. No.: 57,668

[22] Filed: Jun. 2, 1987

Related U.S. Application Data

[63] Continuation of Ser. No. 929,493, Nov. 12, 1986, abandoned, which is a continuation of Ser. No. 585,245, Mar. 1, 1984, abandoned.

[30] Foreign Application Priority Data

Mar. 4, 1983 [JP] Japan .................. 58-35360

[51] Int. Cl.[4] ............... G02B 27/00; G02B 27/44
[52] U.S. Cl. ...................... 350/167; 355/46; 355/67; 355/78
[58] Field of Search ............ 350/167, 431, 415; 355/46, 67, 78; 353/102

[56] References Cited

U.S. PATENT DOCUMENTS

| | | | |
|---|---|---|---|
| 2,380,210 | 7/1945 | Bennett | 350/415 |
| 3,941,475 | 3/1976 | Sheets | 350/167 |
| 3,988,066 | 10/1976 | Suzuki et al. | 350/167 |
| 4,447,111 | 5/1984 | Leib | 350/3.7 |
| 4,497,013 | 1/1985 | Ohta | 362/32 |

OTHER PUBLICATIONS

Hecht et al., *Optics*, 1974, pp. 186-188.

*Primary Examiner*—John K. Corbin
*Assistant Examiner*—David J. Edmondson
*Attorney, Agent, or Firm*—Fitzpatrick, Cella, Harper & Scinto

[57] ABSTRACT

This specification discloses an illuminating optical system in which the optical position of a multi-beam generating optical element along the direction of the optical axis is variable, whereby a desired printing wavelength selected from a wide wavelength range from the UV area to the Deep UV area can be used in the same illuminating optical system and illumination irregularity can be kept very slight.

18 Claims, 3 Drawing Sheets

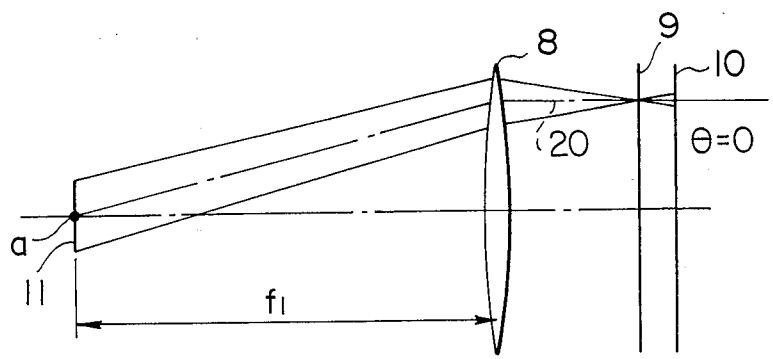
F I G. 3
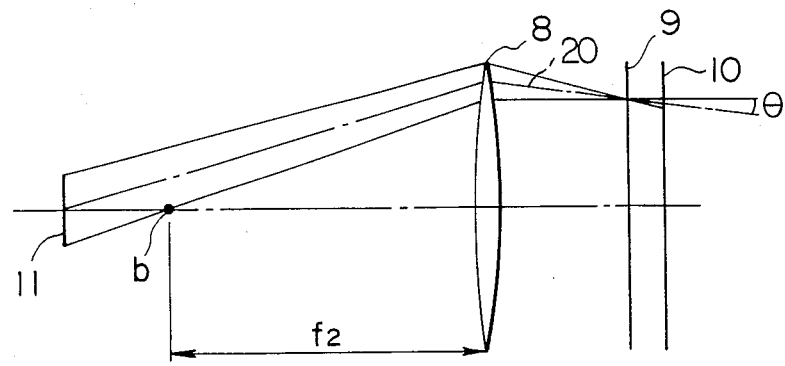
F I G. 4
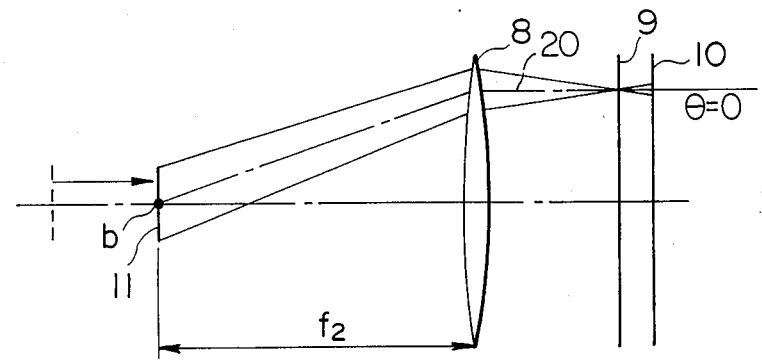
F I G. 5

ILLUMINATING OPTICAL SYSTEM

This application is a continuation of application Ser. No. 929,493 filed 11/12/86, now abandoned, which is a continuation of application Ser. No. 585,245, filed 3/1/84, now abandoned.

BACKGROUND OF THE INVENTION

1. Field of the Invention

This invention relates to an illuminating optical system for transferring a predetermined pattern, and in particular to a mask illuminating optical system for transferring an integrated circuit pattern from a mask to a wafer.

2. Description of the Prior Art

In recent years, in accordance with the requirement for higher density and higher speed, the dimensions of elements included in semiconductor integrated circuits have tended to become minute and the line width of elements transferred onto wafers has decreased from several microns to 1-2 microns and further to the order of sub-microns.

As mask pattern printing methods, there are the contact method in which superposed printing is effected with a mask and a wafer being brought into intimate contact, the proximity method in which a mask is illuminated with the mask and a wafer being spaced apart from each other by several microns to several tens of microns, the projection method in which the pattern on a mask is transferred to the surface of a wafer by the use of a projection optical system, and the step-and-repeat method. Of these methods, the contact method and the profimity method still are those mainly used as the methods of printing semiconductor elements for mass production because of their high throughput or number of elements produced per unit time and the completeness of the printing apparatus.

The resolving power of the contact method is most excellent among the above-mentioned printing methods. However, this method suffers from a problem in achieving intimacy of contact which results from warping of the wafer and mask and non-uniformity of application of the resist layer, and also is liable to cause the film surface to be injured due to the direct contact between the mask and the wafer, thus reducing the yield of production. Particularly, as the pattern becomes more minute, even a slight injury of the film surface may become a fatal defect and therefore, the use of the contact method for the transfer of a minute pattern would suffer from numerous problems. On the other hand, the proximity method in which a mask and a wafer are kept out of contact causes no injury of the film surface of the mask, whereas in this method, the diffraction created between the mask and the wafer adversely affects the image printed and the resolving power is deficient.

The minimum line width W of the pattern image by the proximity method is given by $$W = 15\sqrt{\frac{\lambda \cdot S}{200}} \tag{1}$$

(iEEE, ED-28, No. 11, 1268-1278), where S is the distance between the mask and the resist surface and $\lambda$ is the printing wavelength. It is seen from equation (1) that to increase the resolving power achieved with the proximity method, the wavelength may be shortened or the gap S may be made smaller. However, due to the warping of the wafer and mask, the gap cannot be made smaller than a minimum amount and it is desirable to shorten the printing wavelength. In fact, the wavelength used in the proximity method has become shorter, i.e., from the so-called UV light of 365 nm-436 nm to the Deep UV light of 250 nm-290 nm. However, with a super high pressure mercury lamp or a xenon mercury lamp used as a light source, the energy of the Deep UV area is small as compared with the energy of the UV area, and the sensitivity of photoresist is low in the Deep UV area. Therefore, in printing using the Deep UV light, much exposure time is required and the throughput or number of elements produced per unit time is low.

To efficiently effect pattern transfer in the proximity method, the UV light may be used as the printing wavelength for a rough pattern which does not require a high resolving power and the Deep UV light may be used as the printing wavelength for a pattern which requires a high resolving power. This has heretofore been effected by the use of two types of illuminating optical systems having different printing wavelengths, i.e., a UV illuminating optical system and a Deep UV illuminating optical system.

SUMMARY OF THE INVENTION

It is an object of the present invention to provide an illuminating optical system which enables a desired printing wavelength selected from a wide wavelength range from the UV area to the Deep UV area to be used in the same illuminating optical system and which can keep the illumination irregularity slight. According to the present invention, the optical position of a multi-beam generating optical element along the optical axis is made variable.

The invention will become fully apparent from the following detailed description thereof taken in conjunction with the accompanying drawings.

BRIEF DESCRIPTION OF THE DRAWINGS

FIGS. 3 and 5 show that the forward focus of a condensing collimater lens and the position of a secondary light source have become coincident with each other.

FIG. 4 shows a case where the forward focus of the collimater lens and the position of the secondary light source are not coincident with each other.

DESCRIPTION OF THE PREFERRED EMBODIMENT

Figure 1:
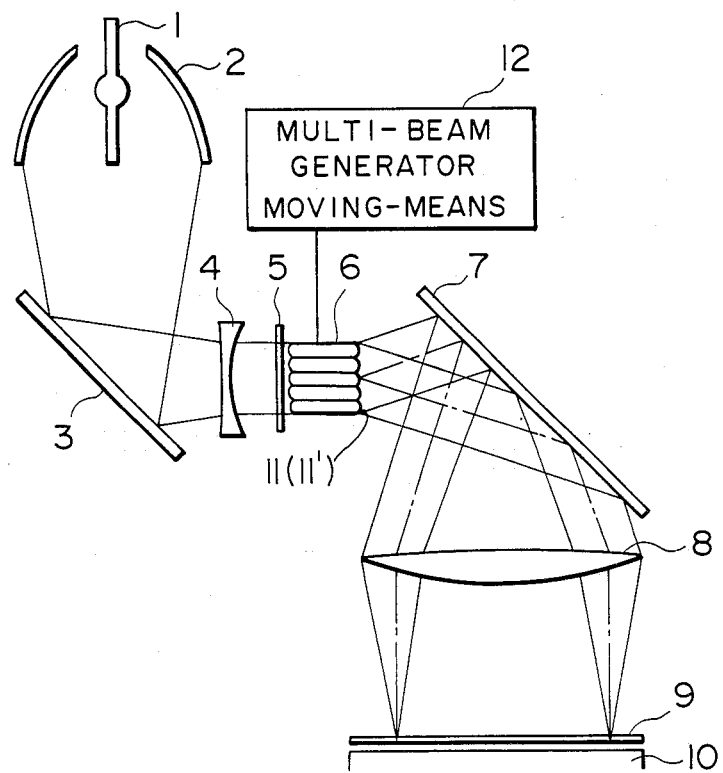
FIG. 1 is an optical cross-sectional view of an embodiment of the present invention which uses an optical integrator as a multi-beam generating optical element.

An embodiment of the present invention will hereinafter be described by reference to FIG. 1. In FIG. 1, reference numeral 1 designates a light source, and reference numeral 2 denotes an elliptical mirror for efficiently condensing the light beam emitted from the light source. Both the light source and mirror are located at the front of the optical system. The elliptical mirror 2 is disposed so that the light source 1 is positioned at a first focus thereof, and condenses the light beam emitted from the light source at a second focus thereof. Reference numeral 3 designates a wavelength selecting mirror such as a multi-layer interference thin film, and reference numeral 4 denotes a collimator lens for collimating the light beam emitted from the first focus of the elliptical mirror and reflected by the elliptical mirror 2 and the wavelength selecting mirror 3. The rearward focus of the collimator lens 4 is coincident with the second focus of the elliptical mirror. Designated by 5 is a shutter for controlling the energy applied onto the surface of a mask. Reference numeral 6 denotes a multi-beam generating optical element for forming a secondary light source having uniform light distribution characteristic. The multi-beam generating optical element 6, together with a collimator lens 8, may uniformly illuminate the mask surface 9. Reference numeral 7 designates a plane mirror for arranging the entire illiminating optical system compactly, and reference numeral 8 designates the collimator lens for illuminating the mask surface 9 at a desired condensation angle without irregularity. The forward focus position of the collimator lens 8 is coincident with a secondary light source formed by the multi-beam generating optical element 6. Reference numeral 9 denotes the mask surface on which a pattern to be transferred is depicted, and reference numeral 10 designates a wafer surface disposed in parallel relation to the mask surface and spaced therefrom by a distance of several microns to several tens of microns.

The light beam emitted from the light source 1 is collected with minimal loss of light by the elliptical mirror 2 and only a desired wavelength range is separated therefrom by the wavelength selecting mirror 3. Subsequently, the light beam is made into a parallel light beam by the collimator lens 4 and illuminates the forward end face of the multi-beam generating optical element 6. In FIG. 1, an optical integrator is used as the multi-beam generating optical element and therefore, a plurality of secondary light sources 11 having uniform light distribution characteristic are formed on the rearward end face 11 of the multi-beam generating optical element 6, and the light beams emitted from these secondary light sources are made into parallel light beams by the collimator lens 8 and uniformly illuminate the mask surface 9. The multi-beam generating optical element may be comprised of a fly's eye lens.

Figure 2:
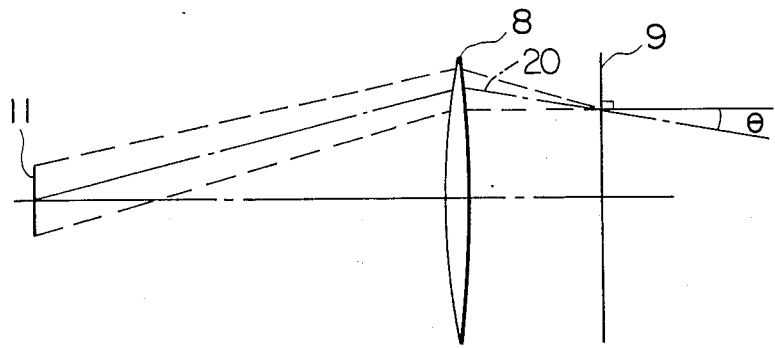
FIG. 2 shows the definition of the angle of inclination ($\theta$) of the principal ray.

In the proximity method, the mask surface and the wafer surface are disposed out of contact with each other. Therefore, where the angle formed between the light ray 20 emitted from the center of the secondary light source 11 and the normal to the mask surface 9 (this angle $\theta$ will hereinafter be referred to as the angle of inclination of the principal ray) is great as shown in FIG. 2, there is created distortion of the image on the wafer surface and this, it is very important in designing to reduce the angle of inclination of the principal ray. The angle of inclination of the principal ray is primarily determined by chromatic aberration, i.e., the focal length of the collimator lens 8 which is dependent on the wavelength, and the spacing between the secondary light source 11 and the collimator lens 8. Therefore, in a wide wavelength range, the angle of inclination of the principal ray cannot be kept small. In the present embodiment, to correct the variation in the focal length of the collimator lens 8 corresponding to the variation in wavelength, the multi-beam generating optical element 6 is moved along the optical axis by a moving means 12 to make the spacing between the multi-beam generating optical element 6 and the collimator lens 8 variable, thereby succeeding in keeping the angle of inclination of the principal ray small in a wide wavelength range. This action is shown in FIGS. 3 to 5. In FIG. 3, if, for simplicity, the spherical aberration of the collimator lens 8 is taken as zero with the angle $\theta$ of inclination of the principal ray 20 being corrected in the UV area, the angle $\theta$ of inclination of the principal ray 20 is zero when the spacing between the secondary light source 11 and the collimator lens 8 is equal to the focal length of the collimator lens. If, in this state, the wavelength selecting mirror 3 is interchanged with another wavelength selecting mirror and the wavelength used is Deep UV, the focal length of the collimator lens will become shorter than in the case of UV and the angle of inclination $\theta$ of the principal ray 20 will become greater as shown in FIG. 4 and thus, the pattern on the mask will be transferred onto the wafer while being shrunken. If the multi-beam generating optical element 6 is moved toward the collimator lens along the optical axis as shown by the arrow in FIG. 5 to correct this and the spacing between the collimator lens and the secondary light source is made equal to the focal length of the collimator lens, the angle $\theta$ of inclination of the principal ray can be made smaller.

The illumination irregularity is determined by the light distribution characteristic of the secondary light sources and the coma of the collimator lens 8, but since the light distribution characteristic of the secondary light sources formed by the multi-beam generating optical element is uniform, only the coma of the collimator lens 8 may be the cause of the illumination irregularity. Where the distance between the secondary light sources and the collimator lens is kept constant, the coma of the collimator lens is varied by wavelength and therefore, the illumination irregularity is also varied. By disposing the secondary light sources always at the focal position of the collimator lens in conformity with the variation in wavelength, the optical arrangement becomes constant irrespective of the variation in wavelength. Therefore, the variation in coma becomes slight and accordingly, the variation in illumination irregularity is also slight.

Figure 6:
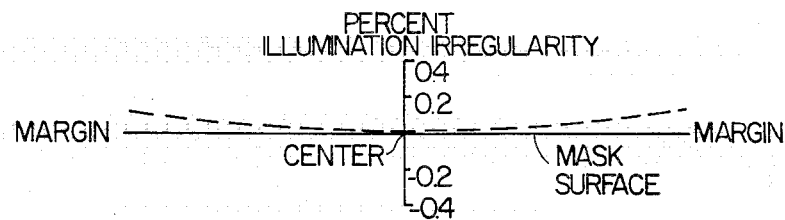
FIGS. 6 to 8 are graphs showing the actually measured values of the illumination irregularity in a case where the secondary light source is varied along the optic axis.
Figure 7:
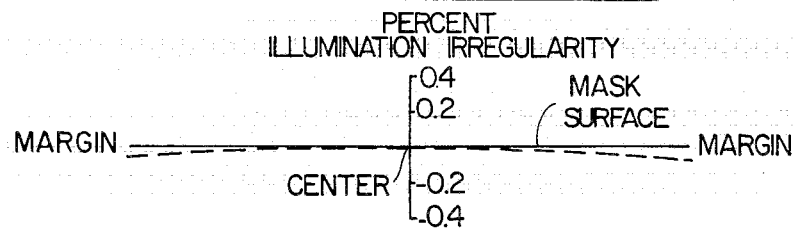
Figure 8:
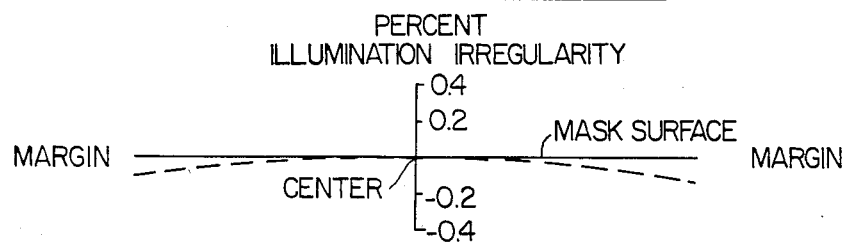

That is, if the multi-beam generating optical element is moved along the optical axis and arrangement is made such that the spacing between the collimator lens and the secondary light sources is equal to the focal length of the collimator lens, the variation in illumination irregularity by the wavelength used can be kept slight. FIGS. 6 to 8 show the values actually measured of the illumination irregularity when 250 nm, 290 nm and 400 nm are used as the printing wavelength (0.2% for one division). It will be seen from these Figures that, for the reason set forth previously, the variation in illumination irregularity can be kept small by moving the multi-beam generating optical element in the direction of the optical axis so that the distance between the optical element and the collimator lens 8 is equal to the focal length of the collimator lens.

Instead of actually moving the multi-beam generating optical element by the moving means 12, a light-transmitting flat plate may be removably disposed between the collimator lens and the multi-beam generating optical element 6 to vary the length of the optical path to thereby cause apparent movement, or the the wavelength selecting mirror may be changed to a filter interchanging system. A wavelength selecting element such as a mirror or a filter need not always be used, but a light having a desired wavelength can be obtained by the use of means for changing the wavelength characteristic of the light source. As a further alternative, one more multi-beam generating optical element may be inserted between the optical element 6 and the collimator lens 8.

Also in the illuminating optical system for the printing by the projection methodk, the elimination of illumination irregularity and the angle of inclination of the principal ray are important factors which determine the printing performance, and according to the present invention, again in the projection method, the printing at different wavelengths by the use of the same illuminating optical system has become possible by making the optical position of the multi-beam generating optical element along the direction of the optical axis variable. However, the angle of inclination of the principal ray in the projection method must be made coincident with the angle of inclination of the principal ray of the projection optical system.

The present invention is also usable in printing by the contact method. That is, in the contact method, the angle of inclination of the principal ray is not an important factor, but the present invention can be used for the correction of illumination irregularity when the printing wavelength is changed.

According to the present invention, as described above, without changing the basic construction of the illuminating optical system, the printing in the wide wavelength range from the UV area to the Deep UV area has become possible while the illumination irregularity is kept slight by the simple operation of changing the optical position of the multi-beam generating optical element along the direction of the optical axis.

We claim:

1. An illuminating optical system for illuminating an object, said optical system comprising:
   light source means for selectively producing light having a desired wavelength;
   a multi-beam generating optical element for receiving the light having a desired wavelength produced by said light source means, and for forming a plurality of light sources that emit light as multiple beams;
   a stationary collimator lens for directing the multiple beams emitted from said multi-beam generating optical element to the object; and
   means for changing an optical path between said plurality of light sources and said stationary collimator lens so as to coincide the position of said plurality of light sources with a focus position of said collimator lens.

2. An illuminating optical system according to claim 1, wherein said multi-beam generating optical element is movable by said changing means in at least one of a direction to shorten the distance between said multi-beam generating optical element and said collimator lens and a direction to lengthen said distance.

3. An illuminating optical system according to claim 1, wherein said changing means includes a light-transmitting flat plate which is removably disposed between said element and said collimator lens.

4. An illuminating optical system according to claim 1, wherein said multi-beam generating optical element is a fly's eye lens.

5. An illuminating optical system for illuminating a mask to transfer a pattern thereon to a wafer, comprising:
   light providing means for providing light;
   wavelength changing means for changing the wavelength of light provided by said light providing means;
   multi-beam forming means for forming multiple beams utilizing light provided by said light providing means;
   optical means for illuminating the mask with light from the multiple beams formed by said multi-beam forming means to transfer the pattern on the mask to the wafer; and
   position changing means for changing a position of said multi-beam forming means relative to said optical means in accordance with the wavelength of the light provided by said light providing means as determined by said wavelength changing means, so as to minimize the illumination distribution on the mask.

6. An illuminating optical system according to claim 5, wherein said multi-beam forming means includes a fly's eye lens.

7. An illuminating optical system according to claim 6, wherein said position changing means includes means for moving said fly's eye lens in a direction of the optical axis of said optical means so as to maintain the position of divergent points of the multiple beams formed by said multi-beam forming means at a focal plane of said optical means.

8. An illuminating optical system according to claim 5 wherein said position changing means includes a light-transmitting flat plate which is removably disposed between said multi-beam forming means and said optical means.

9. An illuminating optical system for illuminating a mask for transferring a pattern thereon to a wafer, comprising:
   light providing means for providing light;
   wavelength changing means for changing the wavelength of the light provided by said light providing means;
   multi-beam forming means for forming multiple beams utilizing light provided by said light providing means;
   optical means for illuminating the mask with light from the multiple beams formed by said multi-beam forming means to transfer the pattern on the mask to the wafer; and
   position changing means for changing the position of said multi-beam forming means relative to said optical means in accordance with the wavelength of the light provided by said light providing means as determined by said wavelength changing means, so as to maintain the angle of inclination of principal rays of said multiple beams directed to the mask substantially the same.

10. An illuminating optical system according to claim 9, wherein said wavelength changing means comprises a wavelength filter for selectively filtering light of a desired wavelength from light including a plurality of wavelengths.

11. An illuminating optical system according to claim 9, wherein said light providing means includes a light source and an ellipitical mirror for directing light from said light source to said multi-beam forming means.

12. An illuminating optical system according to claim 9, wherein said optical means includes lens means for superimposing multiple beams from said multi-beam forming means on the mask.

13. An illuminating optical system according to claim 9, wherein said optical means includes lens means for directing light from said multi-beam forming means onto the mask.

14. An illuminating optical.system according to claim 13, wherein said position changing means comprises means for changing a position of divergent points of the multiple beams, formed by said multi-beam forming means, in a direction of an optical axis of said lens means.

15. An illuminating optical system according to claim 9, wherein said position changing means comprises moving means for moving said multi-beam forming means in a direction of an optical axis thereof.

16. An illuminating optical system according to claim 9, wherein said optical means illuminates the mask with a parallel light beam.

17. An illuminating optical system for illuminating a mask to transfer a pattern thereon to a wafer, comprising:

means for providing light having a desired wavelength;

optical means for illuminating the mask with light provided by said light providing means to transfer the pattern on the mask to the wafer; and controlling means for maintaining constant the angle of inclination of a principal ray of the light directed to the mask when the wavelength of the light provided by said providing means changes.

18. An illuminating optical system for illuminating a mask for transferring a pattern thereon to a wafer, comprising:

light source means for providing light having a desired wavelength;

optical means for illuminating the mask with light provided by said light source means to transfer the pattern on the mask to the wafer; and means for minimizing the change of the illumination distribution on the mask when the wavelength of light provided by said light source means changes.

* * * * *

UNITED STATES PATENT AND TRADEMARK OFFICE
CERTIFICATE OF CORRECTION

PATENT NO. : 4,789,222
DATED : December 6, 1988
INVENTOR(S) : MASAKATU OTA, ET AL.

It is certified that error appears in the above-identified patent and that said Letters Patent is hereby corrected as shown below:

COLUMN 1

Line 33, "profimity" should read --proximity--.
    Line 55, "printed" should be deleted.
    Line 57, "image by" should read --image printed by--.

COLUMN 2

Line 54, "actually mea-" should read --values, actually measured,--.
    Line 55, "sured values" should be deleted.

COLUMN 3

Line 41, "end face 11" should read --end face 11'--.
    Line 49, "angle formed" should read --angle θ formed--.
    Line 50, "the secondary" should read --each secondary--.
    Line 57, "primiarily" should read --primarily--.

COLUMN 4

Line 65, "the the" should read --the--.

COLUMN 5

Line 8, "methodk," should read --method,--.
    Line 31, "the" should be deleted.

UNITED STATES PATENT AND TRADEMARK OFFICE
CERTIFICATE OF CORRECTION

PATENT NO. : 4,789,222
DATED : December 6, 1988
INVENTOR(S) : MASAKATU OTA, ET AL.    Page 2 of 2

It is certified that error appears in the above-identified patent and that said Letters Patent is hereby corrected as shown below:

COLUMN 6

Line 29, "5 wherein" should read --5, wherein--.
Line 63, "ellipitical" should read --elliptical--.

Signed and Sealed this

Seventeenth Day of April, 1990

Attest:

HARRY F. MANBECK, JR.

Attesting Officer     Commissioner of Patents and Trademarks